United States Patent
Russo et al.

(10) Patent No.: US 10,053,772 B2
(45) Date of Patent: Aug. 21, 2018

(54) DOPED GRAPHENE

(71) Applicant: University of Exeter, Exeter Devon (GB)

(72) Inventors: Saverio Russo, Exeter Devon (GB); Monica Craciun, Exeter Devon (GB); Thomas Hardisty Bointon, Exeter Devon (GB)

(73) Assignee: University of Exeter, Exeter (GB)

( * ) Notice: Subject to any disclaimer, the term of this patent is extended or adjusted under 35 U.S.C. 154(b) by 9 days.

(21) Appl. No.: 15/026,437

(22) PCT Filed: Sep. 26, 2014

(86) PCT No.: PCT/GB2014/052913
§ 371 (c)(1),
(2) Date: Mar. 31, 2016

(87) PCT Pub. No.: WO2015/049490
PCT Pub. Date: Apr. 9, 2015

(65) Prior Publication Data
US 2016/0230273 A1      Aug. 11, 2016

(30) Foreign Application Priority Data

Oct. 2, 2013 (GB) .................................... 1317454.5

(51) Int. Cl.
*C23C 16/26* (2006.01)
*C01B 32/194* (2017.01)
(Continued)

(52) U.S. Cl.
CPC ............ *C23C 16/26* (2013.01); *C01B 32/186* (2017.08); *C01B 32/188* (2017.08);
(Continued)

(58) Field of Classification Search
CPC ...... C23C 16/26; C01B 32/194; C01B 32/186; C01B 32/188; H01B 1/04; B82Y 40/00
See application file for complete search history.

(56) References Cited

U.S. PATENT DOCUMENTS

| | | | | |
|---|---|---|---|---|
| 2013/0118791 A1* | 5/2013 | Okamoto | ............... | H05K 1/186 174/260 |
| 2014/0239257 A1* | 8/2014 | Moon | ............... | H01L 29/78684 257/29 |

(Continued)

FOREIGN PATENT DOCUMENTS

WO      2011094204 A2      8/2011

OTHER PUBLICATIONS

Kristin Shepperd et al: Abstract Submitted for the MAR11 Meeting of The American Physical Society Electronic and chemical properties of epitaxial graphene inter-calated with FeCl • Dec. 14, 2010 (Dec. 14, 2010).

(Continued)

*Primary Examiner* — Anita K Alanko
(74) *Attorney, Agent, or Firm* — DeLio, Peterson & Curcio, LLC; Robert Curcio

(57) ABSTRACT

Methods of producing a uniformly or substantially uniformly doped relatively large area multi-layered graphene element are described comprising the steps of placing the graphene element and a dopant under low pressure conditions, and holding the graphene element and dopant at an elevated temperature for a period of time while under the low pressure conditions. In one arrangement, openings are formed in a multi-layered graphene element of relatively large area prior to doping. In another arrangement, a relatively large area multi-layered graphene element formed by (Continued)

an epitaxial growth technique is used. The invention also relates to an element produced using the aforementioned techniques.

11 Claims, 1 Drawing Sheet

(51) Int. Cl.
     *C01B 32/188*      (2017.01)
     *C01B 32/186*      (2017.01)
     *H01B 1/04*      (2006.01)
     *B82Y 40/00*      (2011.01)

(52) U.S. Cl.
     CPC ............. *C01B 32/194* (2017.08); *H01B 1/04* (2013.01); *B82Y 40/00* (2013.01)

(56) References Cited

U.S. PATENT DOCUMENTS

| | | | |
|---|---|---|---|
| 2015/0235960 A1* | 8/2015 | Sato | H01L 23/53276 257/746 |
| 2017/0047588 A1* | 2/2017 | Mukherjee | H01M 4/587 |
| 2017/0057827 A1* | 3/2017 | Sultana | C01B 31/0484 |

OTHER PUBLICATIONS

Mahdi Ibrahim et al: "XPS Depth Profiling of Epitaxial Graphene Intercalated with FeCl 3" • Jan. 1, 2011 (Jan. 1, 2011). XP055156486. Retrieved from the Internet: URL:http://www.ece.gatech.edujacademicsjou treachjstep-upjpresentations/2011/XPS-Dept h-Profiling-of-Epitaxial-Graphene-Intercalated-with-FeCl3.pdf [retrieved on Dec. 3, 2014] p. 10.

Da Zhan et al: "FeCl3-Based Few-Layer Graphene Intercalation Compounds: Single Linear Dispersion Electronic Band Structure and Strong Charge Transfer Doping". Advanced Functional Materials. Wiley—V C H Verlag Gmbh & Co. KGAA. DE. vo 1 • 20. No. 20. Oct. 22, 2010 (Oct. 22, 2010). pp. 3504-3509. XP001558148. ISSN: 1616-301X. DOI: 10.1002/ADFM.201000641 the whole document.

Gregory F. Schneider et al: "DNA Translocation through Graphene Nanopores". Nano Letters. vol. 1 • 10. No. 8. Aug. 11, 2010 (Aug. 11, 2010). pp. 3163-3167. XP055156495. ISSN: 1530-6984. DOI: 10.1021/nl102069z the whole document.

Khrapach et al., Advanced Materials, vol. 24, 2012 "Novel highly conductive and transparent graphene-based conductors" pp. 2844-2849.

* cited by examiner

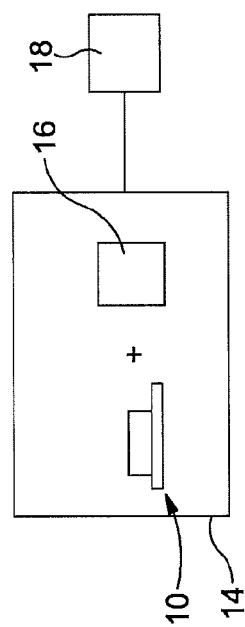
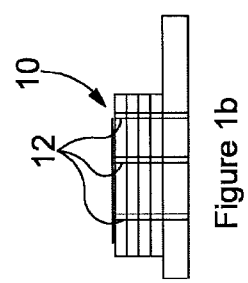
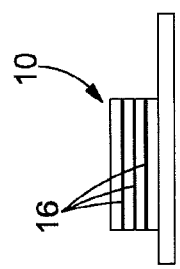
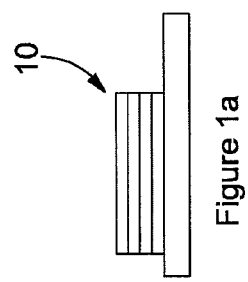

DOPED GRAPHENE

BACKGROUND OF THE INVENTION

1. Field of the Invention

This invention relates to graphene, and in particular to large area uniformly or substantially uniformly doped graphene.

2. Description of Related Art

The doping of graphene, for example to enhance its electrical properties, reducing its electrical resistance, or alter other properties thereof, is known. By way of example, a method is described in Adv. Mat. 24, 2844 (2012) (I Khrapach, et al.) by which small chips of flakes of graphene may be doped with iron (III) chloride. The method involves placing the small chips or flakes of graphene and iron (III) chloride under low pressure conditions for a period of time during which the graphene and iron (III) chloride are heated. This process may be repeated several times. It has been found that the method produces doped few layer graphene chips or flakes, the graphene layers being intercalated with the iron (III) chloride. The resulting doped product is of considerably reduced electrical resistance compared to pristine graphene chips or flakes, with resistance or resistivity values comparable with the best known transparent conductors.

Whilst the method outlined hereinbefore and described in the I Khrapach, et al., paper produces small doped graphene flakes or chips, it has been found that it is only effective when used with small chips or flakes of graphene. Its use with larger area graphene elements has been found to produce non-uniform doping with the result that the graphene elements so doped would be unsuitable for use in the industrial scale production of, for example, electronic equipment. Accordingly, the I Khrapach method has been found to be of only limited applicability.

SUMMARY OF THE INVENTION

It is an object of the invention to provide methods by which uniformly or substantially uniformly doped multi-layered graphene elements of relatively large area can be produced, the method being suitable for use in large or industrial scale manufacturing processes. The invention also relates to doped relatively large area graphene elements produced using the methods.

The above and other objects, which will be apparent to those skilled in the art, are achieved in the present invention which is directed to a method of producing a uniformly or substantially uniformly doped relatively large area multi-layered graphene element comprising the steps of: forming openings in a multi-layered graphene element of relatively large area; placing the graphene element and a dopant under low pressure conditions; and holding the graphene element and dopant at an elevated temperature for a period of time whilst under the low pressure conditions.

The openings may be formed by drilling, and the drilling may be performed using an appropriately controlled laser. The openings may also be formed by etching.

The openings may extend completely through the graphene element or only through some of the layers of the graphene element.

The dopant may comprise iron (III) chloride.

The dopant may comprise a precursor for subsequent substitution with another dopant. In the event a precursor is utilized, the precursor may comprise aluminum chloride and the said another dopant comprises iron (III) chloride.

The element is formed by the transfer of monolayer CVD deposited graphene layers, and may comprise a multi-layer CVD deposited layer transferred onto a substrate. The element preferably has an area of at least 1 cm$^2$.

The elevated temperature is approximately 300° C., and the element is held at the elevated temperature for at least 5 hours.

In a second aspect, the invention is directed to a method of producing a uniformly or substantially uniformly doped relatively large area multi-layered graphene element comprising the steps of: producing a relatively large area multi-layered graphene element by an epitaxial growth technique; placing the graphene element and a dopant under low pressure conditions; and holding the graphene element and dopant at an elevated temperature for a period of time whilst under the low pressure conditions.

In a third aspect, the present invention is directed to a multi-layered uniformly or substantially uniformly doped relatively large area graphene element produced by: forming openings in a multi-layered graphene element of relatively large area; placing the graphene element and a dopant under low pressure conditions; and holding the graphene element and dopant at an elevated temperature for a period of time whilst under the low pressure conditions.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIGS. 1a to 1d are diagrammatic representations illustrating steps in the process for forming a doped relatively large area multi-layer graphene element in accordance with one embodiment of the invention.

DESCRIPTION OF THE PREFERRED EMBODIMENT(S)

In describing the preferred embodiment of the present invention, reference will be made herein to FIGS. 1a-1d of the drawings in which like numerals refer to like features of the invention.

According to one aspect of the invention there is provided a method of producing a uniformly or substantially uniformly doped relatively large area multi-layered graphene element comprising the steps of:

forming openings in a multi-layered graphene element of relatively large area;

placing the graphene element and a dopant under low pressure conditions; and holding the graphene element and dopant at an elevated temperature for a period of time whilst under the low pressure conditions.

The elevated temperature may be in the region of 330° C., for example. The multilayered graphene element may be formed by the transfer of multiple layers of CVD formed or grown graphene onto one another.

By forming openings in the graphene element, it has been found that the intercalation process by which the dopant enters the graphene structure is enhanced as the perimeter of the graphene element through which the dopant can enter is increased for a given area of graphene element. The presence of the openings does not significantly interfere with the optical or electrical properties of the material. The resilience of the material to atmospheric conditions and high temperatures is unchanged.

The openings may be formed by drilling, for example using an appropriately controlled laser, or may be etched into the graphene element.

The openings may extend completely through the graphene element. Alternatively, it may be possible to achieve at least some of the benefits of the invention by forming openings which extend through only some of the layers of the graphene element.

The dopant conveniently takes the form of iron (III) chloride. It will be appreciated, however, that the invention is not restricted in this regard. By way of example, the dopant could comprise a precursor such as aluminum chloride. The precursor may subsequently be substituted with another dopant, for example iron (III) chloride. Such a substitution technique is thought to allow the intercalation process to be accelerated.

The graphene element is conveniently of area at least 0.75 cm$^2$, preferably greater than 1 cm$^2$, and may be considerably larger than this. The element conveniently has between 2 and 10 layers, and thus is a few layer graphene element.

According to another aspect of the invention there is provided a method of producing a uniformly or substantially uniformly doped relatively large area multi-layered graphene element comprising the steps of:
producing a relatively large area multi-layered graphene element by an epitaxial growth technique;
placing the graphene element and a dopant under low pressure conditions; and
holding the graphene element and dopant at an elevated temperature for a period of time whilst under the low pressure conditions.

It has been found that whilst the technique described in the I Khrapach, et al., paper is not suitable for use with relatively large chips or flakes of multi-layer graphene produced using, for example, the Scotch tape technique, where multi-layered graphene is produced by epitaxial growth, intercalation to produce a uniformly or substantially uniformly doped relatively large area graphene element using such a method is possible.

The invention further relates to a multi-layered uniformly or substantially uniformly doped relatively large area graphene element produced using one of the methods described hereinbefore.

A relatively large area, multi-layered graphene element 10 is illustrated in FIG. 1a. By way of example, the element 10 may be of dimensions 1 cm×1 cm. The element 10 may be formed or produced in a range of ways. By way of example, it may be formed by positioning a series of monolayer graphene elements upon one another using a suitable transferring technique such as a wet technique. The monolayer elements may be grown or deposited on a host substrate, for example deposited upon a polycrystalline copper foil using a CVD technique, and subsequently moved using a wet transferring technique so as to be positioned upon one another on a suitable host substrate such as a silicon wafer. Alternatively, a multi-layered graphene element grown on a polycrystalline nickel foil may be wet transferred onto a silicon wafer or other suitable substrate.

The element 10 is modified, as shown in FIG. 1b, to form openings 12 therein. The size and positions of the openings 12 are chosen so as to increase the perimeter through which, during subsequent parts of the process, a dopant can enter the element. By way of example, where the element has an area of 1 cm$^2$ it is thought that the formation of a single opening of diameter in the region of 5 μm formed close to the centre of the element 10 is sufficient. However, the invention is not restricted in this regard. Accordingly, a greater number of openings 12 may be formed. They may be arranged randomly, or may be formed in a predetermined pattern. By increasing the number of openings 12 for a given size of element 10, it will be appreciated that it may be possible to use smaller openings 12 than would otherwise be the case.

The openings 12 may be formed in any convenient manner By way of example, a drilling process may be used in the formation of the openings 12. The drilling process may take the form of a laser drilling process. In such an arrangement, the size holes which can be formed may be governed, to some extent, by the spot size of the laser used in the drilling process.

Rather than use a laser drilling process, a chemical etching process could be used after appropriate masking of the element 10.

The holes 12 may extend through the full thickness of the element 10, or may extend through only part of the element 10, if desired.

After formation of the opening(s) 12 in the element 10, the element 10 and a dopant material 16, for example iron (III) chloride, are positioned within a reaction vessel 14 (see FIG. 1c) such as a sealable glass tube connected to a vacuum pump 18 whereby gas can be extracted from the vessel 14 to reduce the pressure therein. The pressure within the reaction vessel 14 is conveniently reduced to a level below 5×10$^{-4}$ torr, and preferably below 2×10$^{-4}$ torr, and the reaction vessel 14 is heated to raise the temperature of the element 10 and dopant material 16 to around 300° C. The element 10 and dopant material 16 are held at this elevated temperature and reduced pressure for a period of time in the region of 8 hours. Whilst being held at an elevated temperature and reduced pressure, the dopant is able to infiltrate or enter the element 10 from the periphery or perimeter thereof, entering between the layers of the element 10 to form an intercalated product. The dopant 16 can also enter the element 10 at the perimeter or periphery of the holes 12. It will be appreciated, therefore, that entry of the dopant 16 into the element 10 is enhanced.

After completion of the steps outlined hereinbefore, the reaction vessel 14 is cooled and the pressure therein allowed to return to atmospheric pressure. The dopant material 16 which has infiltrated between the layers of the element 10 will tend to remain in position, as shown in FIG. 1d.

By forming one or more openings 12 in the element 10 prior to performing the doping operation, the length of the perimeter of the element 10 through which the dopant material 16 is able to enter the element 10 is increased, and dopant is able to enter the element 10 at positions other than just at the edges of the element 10. As a result, doping of the element 10 occurs relatively quickly, and a relatively uniformly doped element 10 is produced.

It has been found that by the use of the technique described hereinbefore, a graphene element of substantially uniform doping can be produced, the doping of the element resulting in the element having a resistivity in the region of 16Ω/D. The doped element has a good optical transmittance and environmental stability, having values similar to those of commonly used Indium Tin Oxide. To demonstrate the effectiveness of the technique, a series of tests have been conducted on an element 10 doped using the technique described hereinbefore.

It was found that the resistance of a treated or doped element produced using the technique outlined hereinbefore had a resistance significantly lower than that of a pristine, non-doped element. By conducting Raman spectroscopy on an element doped using the technique outlined hereinbefore and on a pristine, non-doped element it was found that peaks indicative of the intercalation of iron (III) chloride were present in the doped sample, and that the peaks indicated a decoupling of the layers of graphene, which is also indicative of the success of the intercalation procedure. The doping of the graphene, whilst enhancing the electrical properties of the graphene element, did not significantly affect the optical properties thereof, the element 10 still being of high optical transmittance.

In an alternative technique in accordance with another embodiment of the invention, the graphene element 10, rather than taking the form of a series of monolayers which have been transferred onto one another or a multi-layer element produced by the use of a CVD technique, the element 10 takes the form of an epitaxially formed or grown multi-layered graphene element 10. In this embodiment, the element 10 comprises epitaxially grown graphene on a 4H- or 6H-SiC substrate. The element has a surface area in the region of 1 cm$^2$.

It has been found that with such an element, despite the layer spacing being smaller than is the case where the element is formed using other techniques, intercalation or infiltration of a dopant into the element 10 can occur reasonably quickly to produce a uniformly or substantially uniformly doped element without the need to form openings in the element 10. The step of forming one or more openings 12 is thus omitted in this embodiment, and the element 10 is placed, along with the dopant material 16 into the reaction vessel 14, where the pressure and temperature are controlled substantially as hereinbefore described. In this embodiment, the element 10 was held at an elevated temperature for a period in the region of 24 hours.

As with the first embodiment, the technique of the second embodiment resulted in the formation of a substantially uniformly doped multi-layer graphene element containing a relatively small number of graphene layers. The element was of low resistance and of high optical transmittance. Raman spectroscopy techniques and the like were used to confirm that the intercalation process successfully resulted in the proper intercalation of the element.

Whilst in the arrangements described hereinbefore the dopant material is intercalated directly into the element, either of the techniques outlined may be modified such that, initially, a precursor such as aluminum chloride is intercalated into the element. After the initial intercalation, a substitution operation may be performed to substitute the aluminum chloride with iron (III) chloride.

It will be appreciated that a substantially uniformly doped relatively large area multi-layered graphene element produced in accordance with embodiments of the invention may be used in a wide range of electronic devices. The inherent strength of graphene in combination with its optical transmittance, along with the reduced electrical resistance arising from the doping of the element, makes it a good candidate for use in products such as screens or displays, including touch-screens, for electric or electronic devices. However, it will be appreciated that the element may be used in a number of other electrical or electronic devices.

Whilst iron (III) chloride is the dopant described hereinbefore and its use is advantageous, it will be appreciated that depending upon the end use of the doped element, the use of other dopant materials may be preferred. By way of example, gold (III) chloride, cobalt (II) chloride or copper (ii) chloride may be used.

Whilst specific embodiments of the invention have been described hereinbefore, it will be appreciated that a wide range of modifications and alterations may be made to the arrangements described hereinbefore without departing from the scope of the invention as defined by the appended claims.

Thus, having described the invention, what is claimed is:

1. A method of producing a uniformly or substantially uniformly doped area multi-layered graphene element comprising the steps of:
    forming openings in a multi-layered graphene element of;
    placing the graphene element and a dopant under low pressure conditions, lower than atmospheric pressure; and
    holding the graphene element and dopant at an elevated temperature, higher than ambient temperature, for a period of time whilst under the low pressure conditions;
    wherein the openings extend only through some of the layers of the graphene element.

2. A method according to claim 1, wherein the openings are formed by drilling.

3. A method according to claim 2, wherein the drilling is performed using an appropriately controlled laser.

4. A method according to claim 1, wherein the openings are formed by etching.

5. A method according to claim 1, wherein the dopant comprises iron (III) chloride.

6. A method according to claim 1, wherein the dopant comprises a precursor for subsequent substitution with another dopant.

7. A method according to claim 6, wherein the precursor comprises aluminum chloride and the said another dopant comprises iron (III) chloride.

8. A method according to claim 1, wherein the element is formed by the transfer of monolayer CVD deposited graphene layers.

9. A method according to claim 1, wherein the element comprises a multi-layer CVD deposited layer transferred onto a substrate.

10. A method of producing a uniformly or substantially uniformly doped large area multi-layered graphene element comprising the steps of:
    forming openings in a multi-layered graphene element of large area;
    placing the graphene element and a dopant under low pressure conditions, lower than atmospheric pressure; and
    holding the graphene element and dopant at an elevated temperature, higher than ambient temperature, for a period of time whilst under the low pressure conditions;
    wherein the openings extend only through some of the layers of the graphene element, and wherein the large area is at least 1 cm$^2$.

11. A method according to claim 1, wherein the elevated temperature is around 300° C., and the element is held at the elevated temperature for at least 5 hours.

* * * * *